(12) United States Patent
Calaman et al.

(10) Patent No.: US 6,578,626 B1
(45) Date of Patent: Jun. 17, 2003

(54) LIQUID COOLED HEAT EXCHANGER WITH ENHANCED FLOW

(75) Inventors: Douglas P. Calaman, Landisville, PA (US); Mathew J. Connors, Lancaster, PA (US)

(73) Assignee: Thermal Corp., Stanton, DE (US)

( * ) Notice: Subject to any disclaimer, the term of this patent is extended or adjusted under 35 U.S.C. 154(b) by 46 days.

(21) Appl. No.: 09/717,860

(22) Filed: Nov. 21, 2000

(51) Int. Cl.[7] .................................................. F28F 7/00
(52) U.S. Cl. ...................... 165/80.4; 165/170; 165/185; 361/699; 257/714
(58) Field of Search ............................. 165/80.3, 80.4, 165/104.26, 104.33, 185, 168–170; 257/714; 361/699

(56) References Cited

U.S. PATENT DOCUMENTS

| | | | |
|---|---|---|---|
| 838,703 A | * 12/1906 | Fouché | 165/170 |
| 2,911,201 A | * 11/1959 | Gier, Jr. | 165/170 |
| 3,327,776 A | * 6/1967 | Butt | 165/80.4 |
| 4,151,548 A | * 4/1979 | Klein et al. | 165/80.4 |
| 4,970,579 A | 11/1990 | Arldt et al. | 357/81 |
| 5,166,775 A | 11/1992 | Bartilson | 361/383 |
| 5,666,269 A | * 9/1997 | Romero et al. | 165/80.4 |
| 5,761,037 A | * 6/1998 | Anderson et al. | 165/104.26 |
| 5,829,516 A | 11/1998 | Lavochkin | 165/80.4 |
| 5,841,634 A | 11/1998 | Visser | 361/699 |
| 5,978,220 A | * 11/1999 | Frey et al. | 165/80.4 |
| 5,983,997 A | * 11/1999 | Hou | 165/80.4 |
| 6,082,443 A | * 7/2000 | Yamamoto et al. | 165/104.26 |
| 6,169,658 B1 | * 1/2001 | Arena et al. | 165/80.4 |
| 6,230,789 B1 | * 5/2001 | Pei et al. | 165/80.3 |

* cited by examiner

*Primary Examiner*—Christopher Atkinson
(74) *Attorney, Agent, or Firm*—Duane Morris LLP

(57) ABSTRACT

A liquid-cooled heat sink is provided having a cooling housing including a peripheral side wall extending from the perimeter of a bottom wall and a lid sized to engage the peripheral side wall so as to form a chamber. A fluid inlet port and a fluid outlet port are defined through the lid, and disposed in fluid communication with the chamber. In one embodiment, a plurality of pins project outwardly from the bottom wall so as to be positioned within the chamber and arranged in a staggered pattern. The pins include an end that engages the undersurface of the lid. In an alternative embodiment, a corrugated fin having a plurality of corrugations is positioned within the chamber so that at least one of the corrugations engages the bottom wall and at least one of the corrugations engages the under surface of the lid.

4 Claims, 6 Drawing Sheets

LIQUID COOLED HEAT EXCHANGER WITH ENHANCED FLOW

FIELD OF THE INVENTION

The present invention generally relates to liquid-cooled heat sinks, and more particularly to a liquid-cooled heat sink for electronic devices that includes obstructions for optimizing turbulence and increasing surface area for effective heat transfer to the stream of liquid.

BACKGROUND OF THE INVENTION

The performance of electronic circuits and their semiconductor devices is limited by temperature. Semiconductor device performance degrades when the internal temperature reaches or exceeds a particular limit. That limit depends upon the nature of the semiconductor device. In order to maintain or increase the performance of such devices, they must be cooled in some way. The manner of cooling depends upon many parameters, including the space available for the cooling process, the temperatures to be encountered, power, etc. In some instances simply passing a fluid over the device or, over a finned heat sink that is attached to the device, is sufficient to maintain the semiconductor at safe operating temperatures.

In one known semiconductor device cooling technique, convecting fins are attached to a semiconductor package, or the package is affixed to a larger metal member, referred to as a heat sink or cold plate. This heat sink draws heat away from the semiconductor device and can be air cooled or liquid cooled, depending upon the particular application. If the heat sink is air cooled it will typically have heat convecting fins.

Different cooling fluids may be used, when liquid cooled methods are employed, depending upon the application and the density of the electronic devices in a given circuit. Boiling liquids are often used, such as fluorinated hydrocarbon refrigerants, which are delivered to the cold plate in liquid form and are boiled to remove heat. These systems often have the highest heat removal rate for a limited "cold plate" area, but require a considerable amount of power to operate, i.e. to be pumped to and from the heat transfer site. In other systems, a cold liquid is circulated through the cold plate with the cold liquid being refrigerator cooled, evaporatively cooled, or convectively cooled.

A problem exists in the foregoing prior art systems in that a portion of the liquid used to cool the semiconductor device tends to stagnate in a region close to the surface of the heat sink. This stagnation typically refers to a reduction in coolant speed near the heat sink surface. Here the coolant flows at a slower than required speed to adequately remove heat from the heat sink surface. This stagnation reduces the effectiveness of the heat transfer in the cooling system. Very often, the rate of cooling is less than the rate at which heat arrives at that interface surface, which causes an accumulation of heat at the surface. Several options have been proposed in the art to reduce this effect, including increasing the speed of the flow of the coolant or introducing structural features which cause turbulent flow and increased effective surface area.

For example, in U.S. Pat. No. 5,316,075, issued to Quon, a liquid-cooled heat sink is disclosed that includes a planar baffle with only one inlet plenum and one outlet plenum. Holes are formed within the baffle, in parallel rows, to produce jets of liquid coolant within the heat sink. In one embodiment, a mounting plate includes a forest of pins extending downward from its undersurface. The pins are inserted in holes in a mounting plate and extend toward the bottom surface of the mounting plate. The pins each have free ends, and are on centers half the distance of the centers of liquid injection/removal nozzles. There is no pin directly opposite a nozzle. When assembled, a space between the pins is directly opposite the nozzles so that the liquid jet issuing from the nozzle strikes the undersurface of a mounting plate. As the liquid leaves that strike area and travels to the outlet nozzle, it passes through the forest of pins. Quon's pins must be rectangularly arranged on rectangular centers, and be half the distance between the nozzles.

A number of disadvantages exist with this approach. For one thing, a perforated baffle is used to produce jets of liquid in order obtain a very high flow rate of liquid to achieve adequate average flow and to reduce stagnation of the coolant. This flow requires a larger, more expensive pump, even though the back pressure across the baffle is low. For another thing, Quon's pins must be rectangularly arranged on rectangular centers which is wholly inadequate to produce optimum turbulence in the flowing coolant. Quon also relies primarily upon his arrangement of plenums, baffles and jet producing holes to reduce or eliminate the stagnation region. This arrangement of parts is not only cumbersome to manufacture and assemble, but is wholly unnecessary to reduce or eliminate coolant stagnation at the region close to the surface of the heat sink.

SUMMARY OF THE INVENTION

A liquid-cooled heat sink is provided having a housing including a peripheral side all extending from the perimeter of a bottom wall and a lid sized to engage the peripheral side wall so as to form a chamber. A fluid inlet port and a fluid outlet port are defined through the lid, and disposed in fluid communication with the chamber. A plurality of pins project outwardly from the bottom wall so as to be positioned within the chamber and arranged in a staggered pattern. The pins include an end that engages the lid to provide structural support, and to prevent deflection of the lid by high liquid pressure.

In one alternative embodiment of the invention, a liquid-cooled heat sink is provided having a housing including a peripheral side wall extending from the perimeter of a bottom wall and a lid sized to engage the peripheral side wall so as to form a chamber. A fluid inlet port and a fluid outlet port are defined through the lid, and disposed in fluid communication with the chamber. A fin having a plurality of corrugations is positioned within the chamber so that at least one of the corrugations engages the bottom wall and at least one of the corrugations engages the under surface of the lid.

BRIEF DESCRIPTION OF THE DRAWINGS

These and other features and advantages of the present invention will be more fully disclosed in, or rendered obvious by, the following detailed description of the preferred embodiment of the invention, which is to be considered together with the accompanying drawings wherein like numbers refer to like parts and further wherein.

DETAILED DESCRIPTION OF THE PREFERRED EMBODIMENTS

Figure 1:
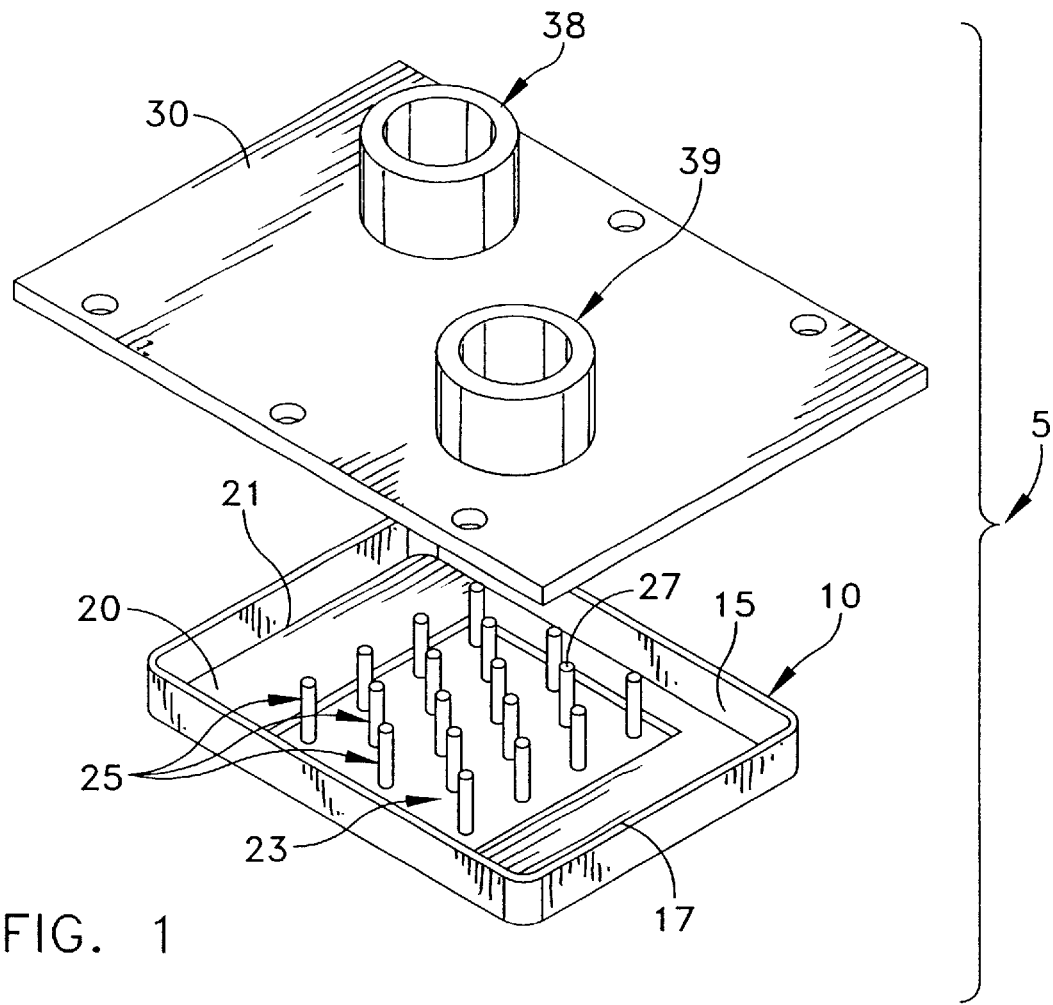
FIG. 1 is an exploded perspective view of a liquid cooled heat sink formed in accordance with one embodiment of the present inventions.
Figure 2:
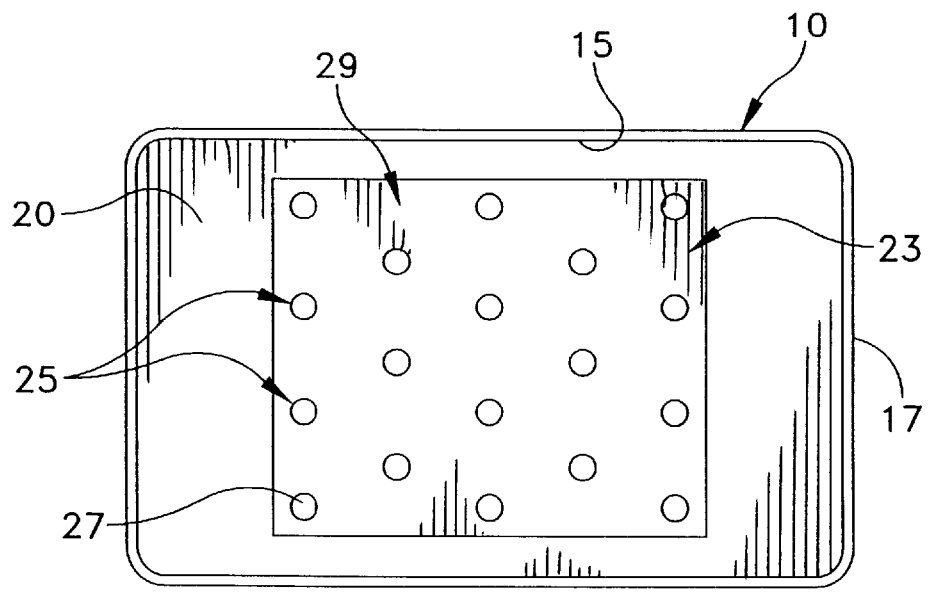
FIG. 2 is a top plan view of a housing having an array of pins, as shown in FIG. 1.
Figure 3:
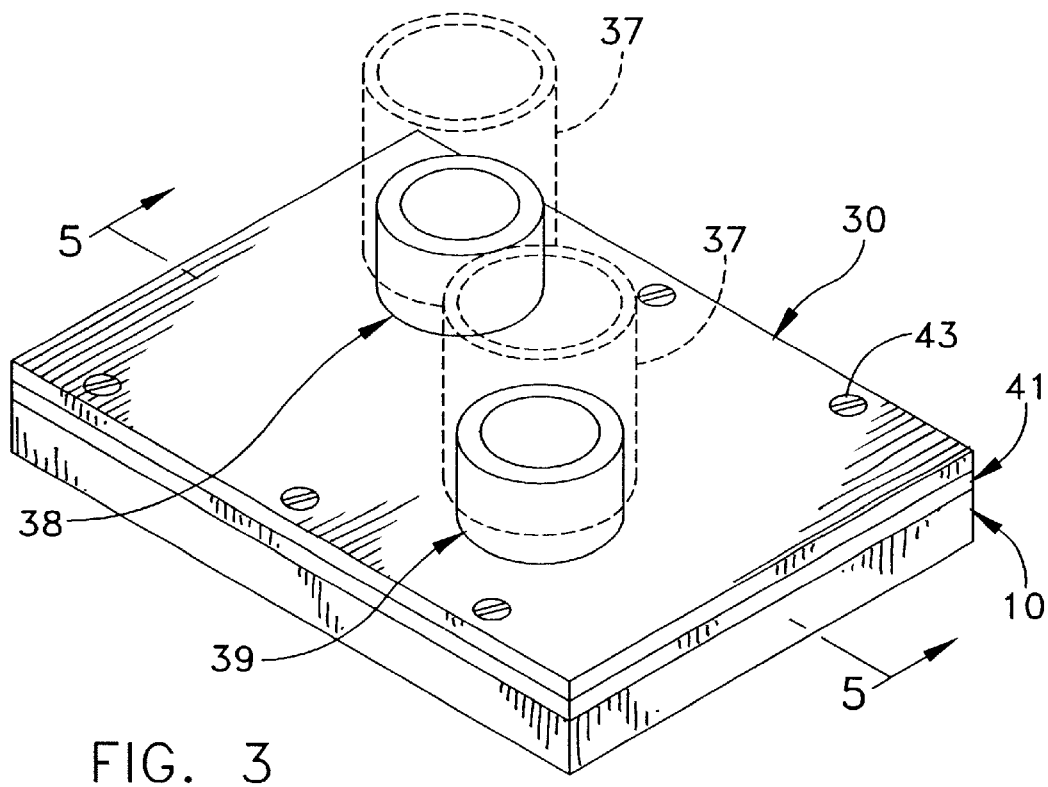
FIG. 3 is a prospective view of a fully assembled liquid cooled heat sink.
Figure 5:
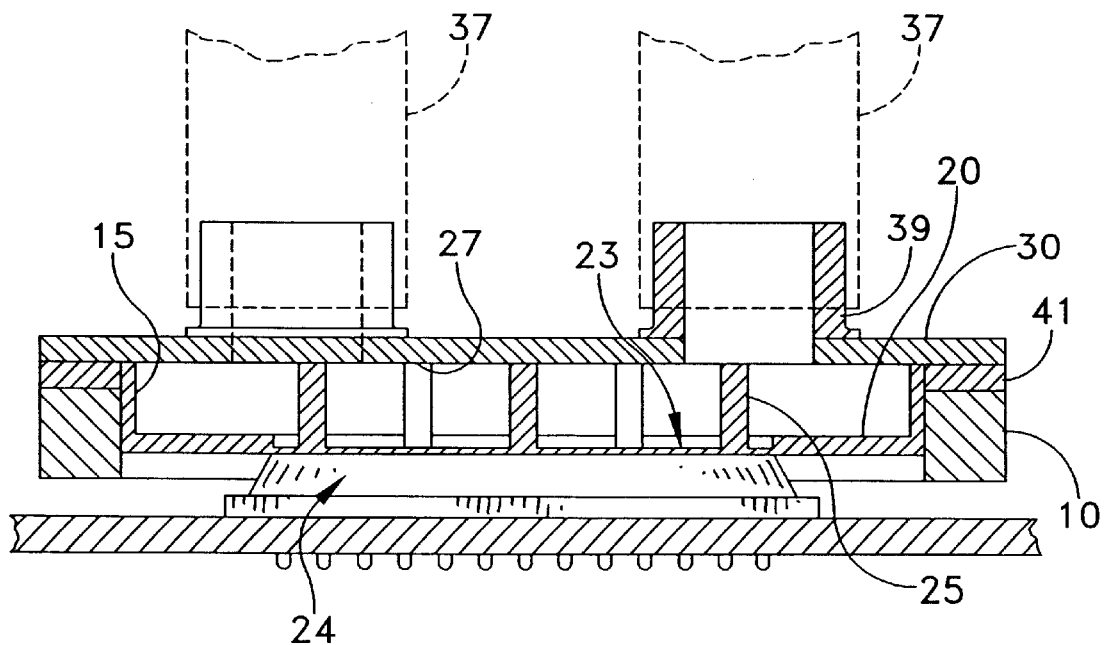
FIG. 5 is a cross-sectional view of the liquid cooled heat sink shown in FIG. 3, as taken along line 5—5.

This description of preferred embodiments is intended to be read in connection with the accompanying drawings, which are to be considered part of the entire written description of this invention. In the description, relative terms such as "horizontal," "vertical," "up," "down," "top" and "bottom" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship.

Referring to FIGS. 1–4, one embodiment of a liquid-cooled heat sink 5 formed in accordance with the present invention comprises a housing 10 including a peripheral side wall 15 that extends upwardly from the perimeter of a bottom wall 20, and includes a top edge surface 17. More particularly, housing 10 is formed from a thermally conductive material, such as copper, steel, etc., and is typically milled as a single piece. Bottom wall 20 is often rectilinear in shape, with side wall 15 arranged in substantially perpendicular relation to a perimeter edge 21. A recessed portion 23 of bottom wall 20 is formed by thinning bottom wall 20 so as to reduce its thermal resistance in that location. The outer surface of recessed portion 23 of bottom wall 20 is adapted to interface with a semiconductor device directly, or to interface with the semiconductor device's packaging 24 so as to provide a conduit for thermal energy generated by the semiconductor device. Such an adaptation may include the introduction of a material having greater thermal conductivity properties than the material that forms the housing as a whole, e.g., silver, diamond, etc.

A plurality of pins 25 project outwardly in substantially perpendicular relation to the interior surface of recessed portion 23 of bottom wall 20. Each individual pin 25 is preferably cylindrically shaped, but may have any number of other cross-sectional shapes including, but not limited to circular, rectilinear, elliptical, generally polygonal, etc. At least a portion of plurality of pins 25 have a length that positions their free end 27 at or slightly above top edges surface 17 of side wall 15.

Significantly, plurality of pins 25 are arranged in a series of rows to form a non-rectangular, staggered pattern or grid of pins 29, i.e., a series of rows of pins 25 where the pins in adjacent rows are not placed one behind the other, but rather are shifted transversely relative to one another such that pins in adjacent rows are off-set with respect to one another. In this way, a portion of the coolant fluid flowing through the staggered grid of pins 29 engages each of pins 25 along their length, while another portion of the coolant fluid flowing through staggered grid of pins 29 passes through the gap formed between adjacent pins 25 so as to directly impinge upon a pin positioned in the next row and spaced from the gap. Unlike prior art pin arrays, however, coolant that does not initially engage a pin 25 in a first row will subsequently engage a pin 25 disposed in the next row of pins as a result of the staggered, off-set pattern. Staggered pattern of pins 29 significantly increases the level of turbulence in the flowing coolant liquid. No jets of liquid coolant are required to enhance turbulent flow. Advantageously, coolant entering housing 10 may impinge directly upon a pin end 27, a portion of a pin end 27, or directly and entirely onto the surface of recessed portion of 23 of bottom wall 20 without affecting the heat transfer characteristics of liquid-cooled heat sink 5. This greatly reduces the cost of manufacturing of heat sink 5, while at the same time increasing the heat transfer characteristics of the device.

Figure 4:
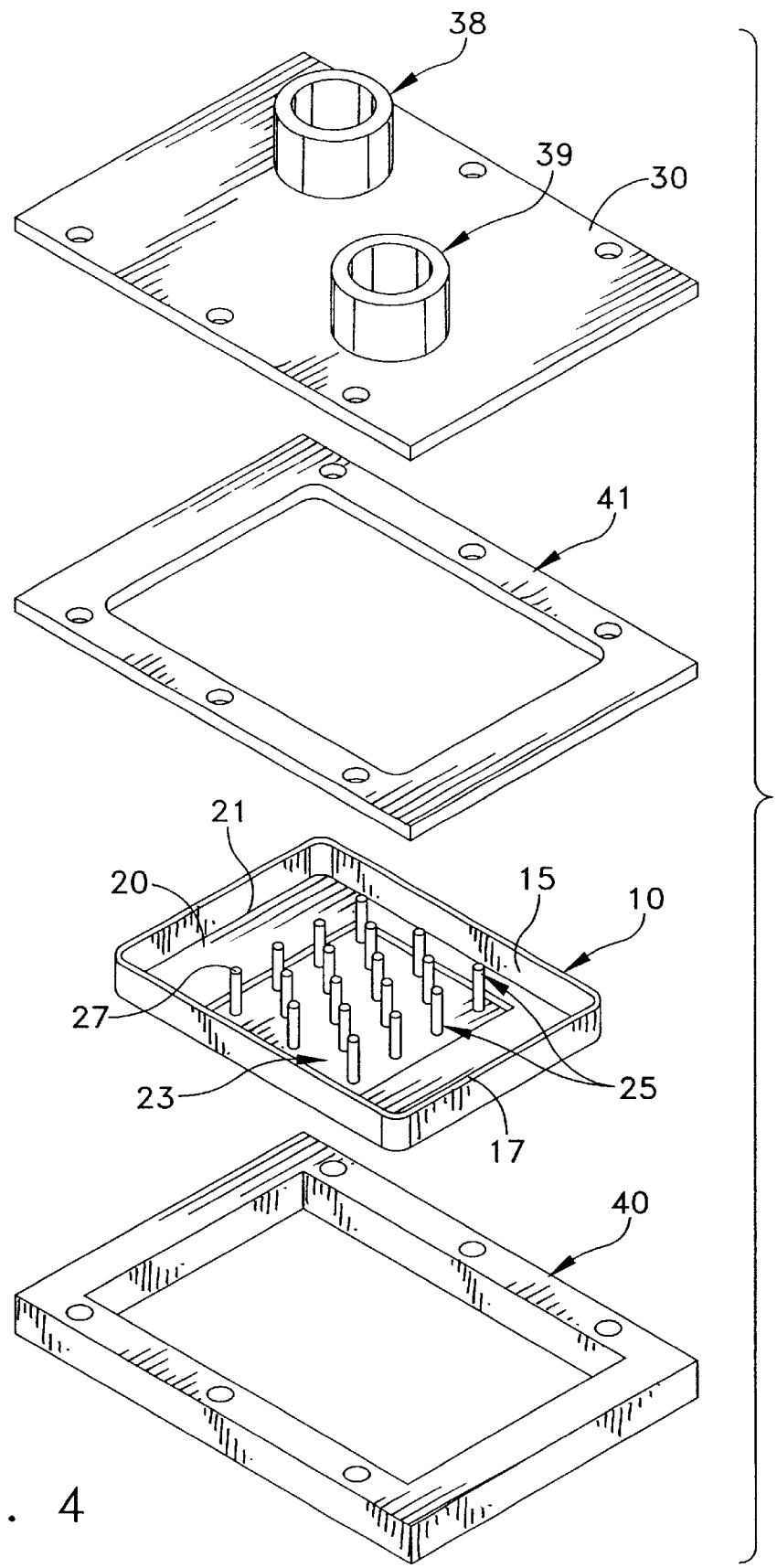
FIG. 4 is an exploded perspective view of the heat sink shown in FIG. 3.

A lid 30 is sized and shaped to engage top edge surface 17 of side wall 15 so as to enclose pin grid 29 in a chamber that is defined between side wall 15, bottom wall 20, and lid 30. Fluid inlet port 38 and outlet port 39 are arranged on lid 30 so as to be in fluid communication with pin grid 29 and a conventional conduit, e.g., hoses 37. A fluid inlet port 38 and a fluid outlet port 39 are defined through lid 30 so as to be in fluid communication with pin grid 29. Pin ends 27 of at least some of pins 25 engage the under surface of lid 30, and are preferably brazed or welded to lid 30. In this way, pins 25 also provide structural reinforcement so as to prevent deflection of lid 30 when high pressure liquid is introduced into liquid-cooled heat sink 5. Referring to FIG. 4, liquid-cooled heat sinks may be assembled to the structure supporting the electric circuit by means of a frame 40. Lid 30 is fastened to frame 40 by conventional fasteners 43, by welding, or by any other conventional fastening means that will ensure a liquid tight seal. A thermally insulating gasket 41 is positioned between the under surface of lid 30 and frame 40 to prevent unwanted thermal interactions.

Figure 6:
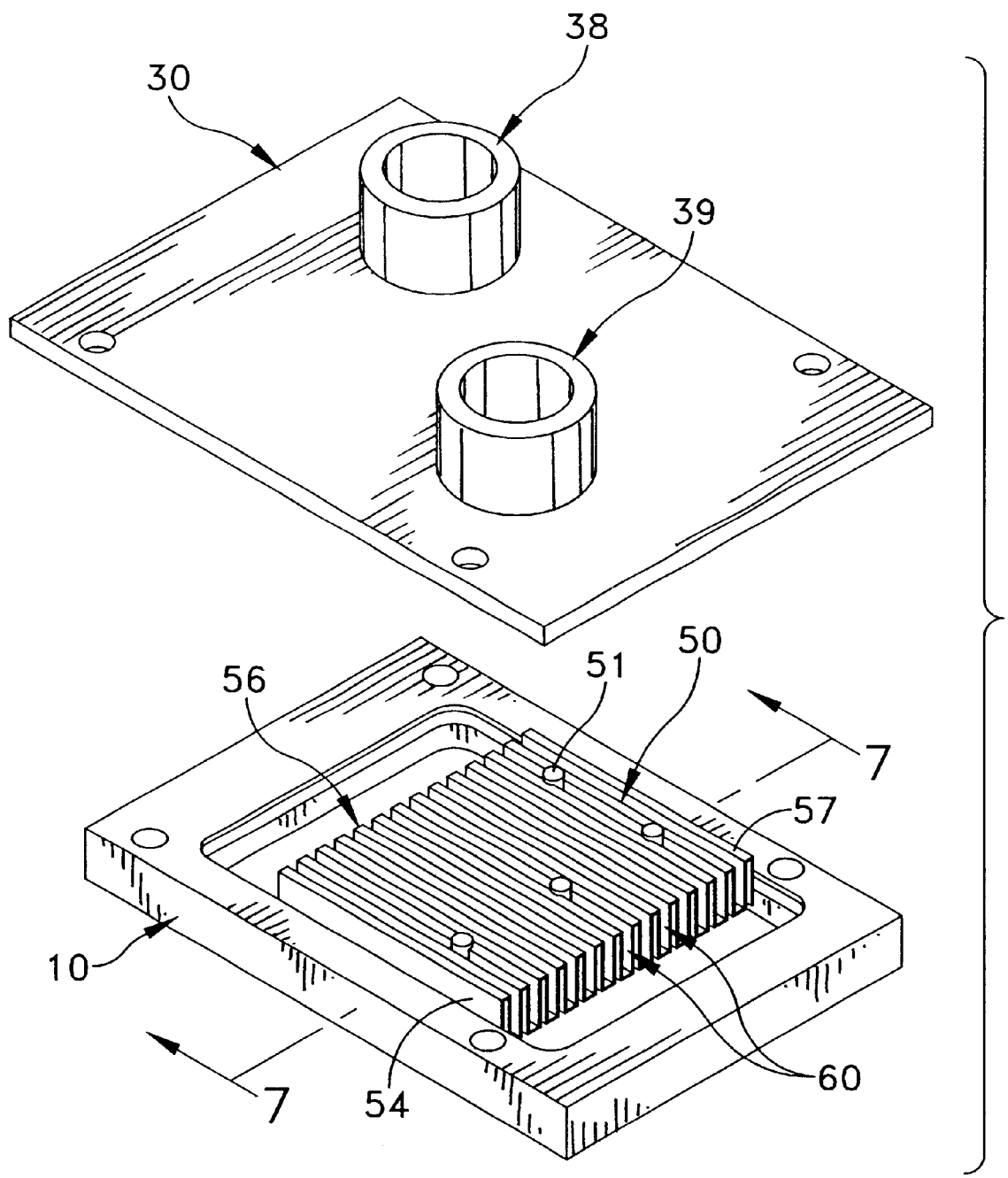
FIG. 6 is a perspective, exploded view of an alternative embodiment of the liquid cooled heat sink shown in FIG. 1.
Figure 7:
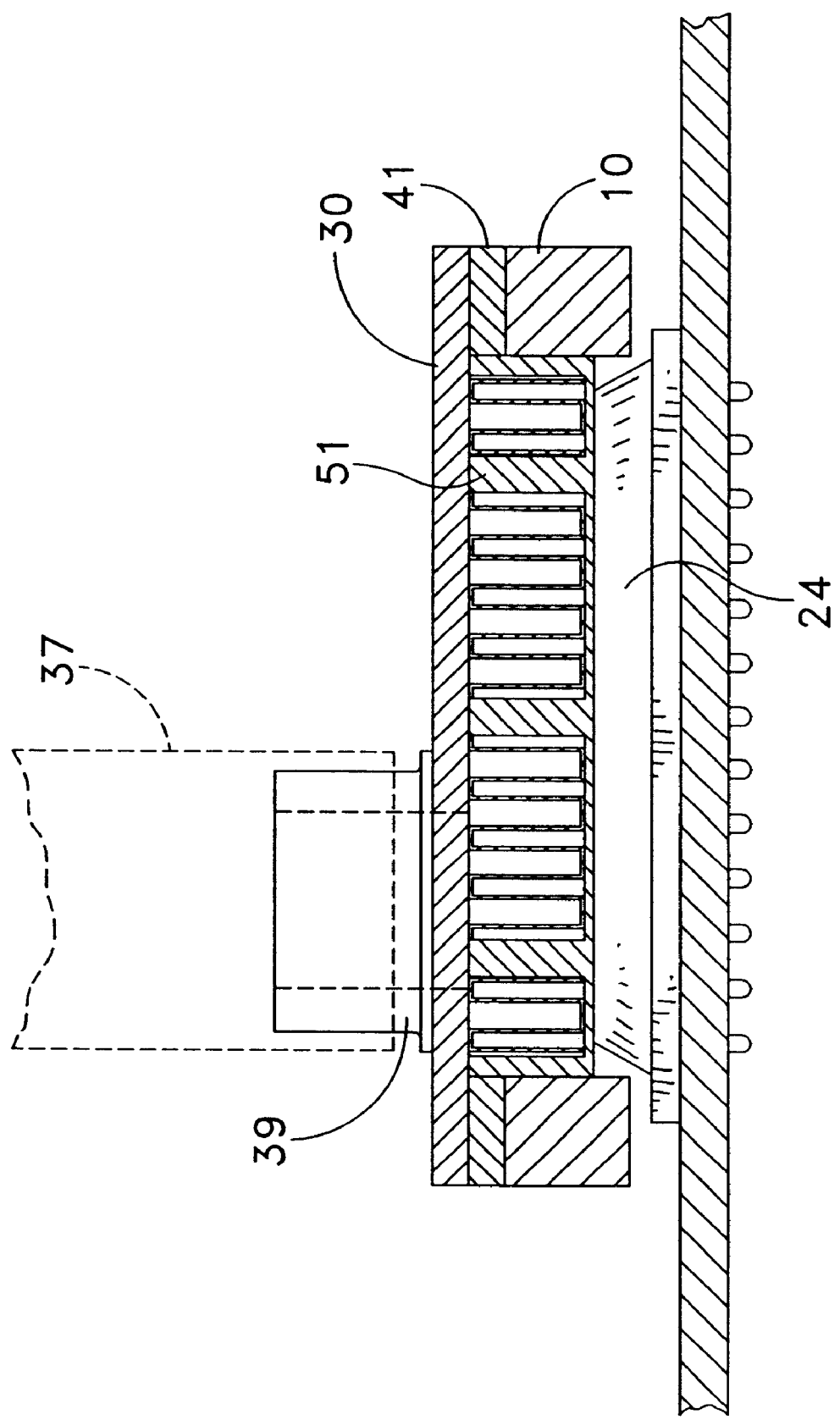
FIG. 7 is a cross-sectional view of the liquid cooled heat sink shown in FIG. 6, as taken along line 7—7.
Figure 8:
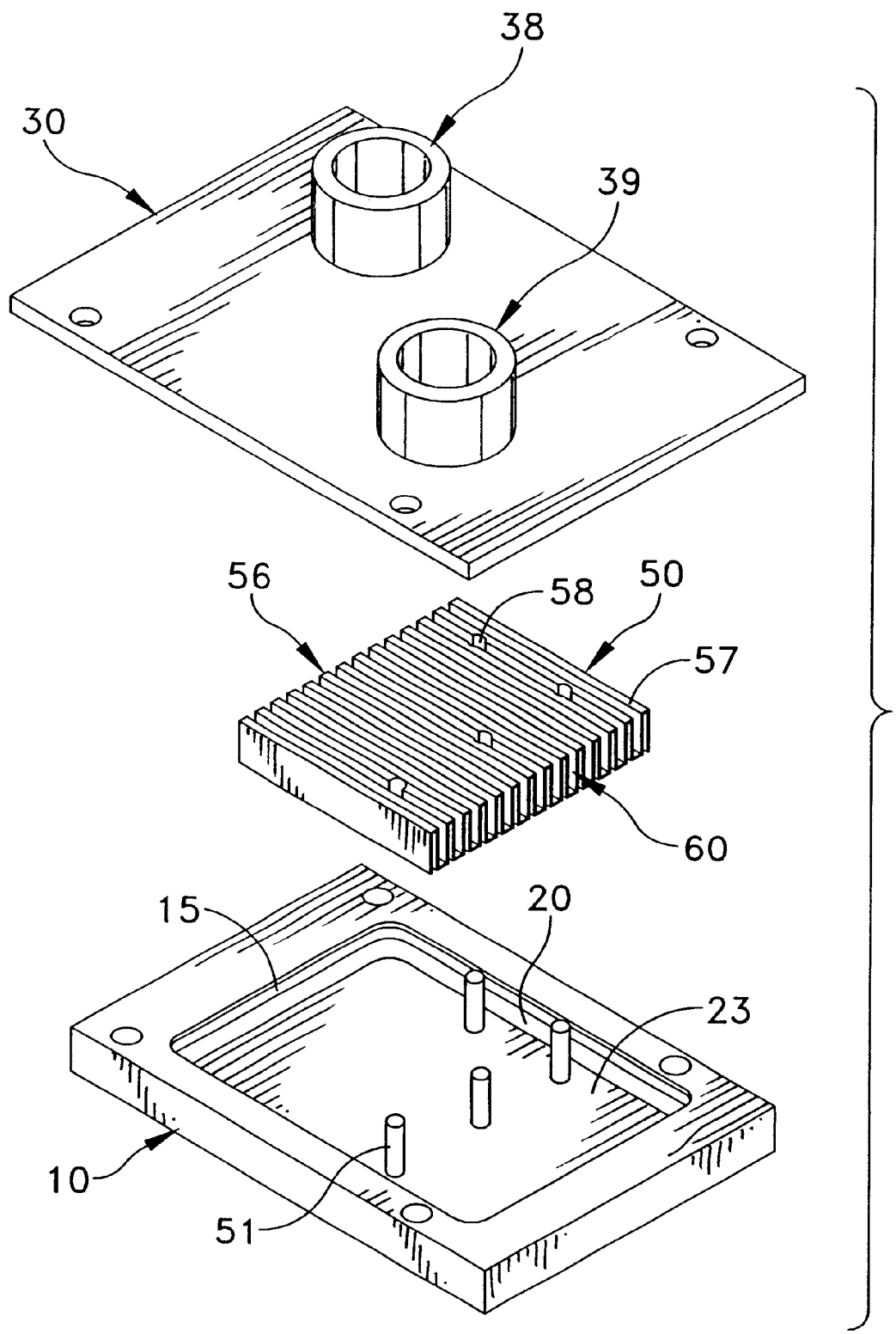
FIG. 8 is a prospective, exploded view of the liquid cooled heat sink shown in FIGS. 6 and 7.

Referring to FIGS. 6–8, an alternative embodiment of the invention is provided in which a corrugated or folded fin 50 is fixed in position within housing 10 by a plurality of pins 51. More particularly, fin 50 is made up of a series of thin, flat fin walls 54, folded relative to one another about crests 56. Crests 56 are shaped so as to be substantially flat, rather than sharply pointed. This arrangement provides a surface that is less prone to damage, and is more suitable for brazing, soldering, or welding to recessed portion 23 of bottom 20 and to the undersurface of lid 30. Although crests 56 are not pointed and sharp, fin walls 54 may themselves have a divergent shape, rather than being parallel to one another.

In one embodiment, fin walls 54 are packed so closely as to be effectively parallel to one another, with a constant wall-to-wall separation equal to the flat top wall 57 formed by crest 56. A plurality of through holes 58 are defined through fin 50, and are arranged in a pattern to match the pattern of pins 51 that project outwardly from recessed portion 23 of bottom 20. In this way, fin 50 ray be positioned within housing 10 in such a way that each pin 51 is received within a respective through-hole 58, thereby assuring proper alignment of fin 50 within housing 10 and providing structural support and reinforcement. It will be understood that only one pin 25 need be received within a through-hole to properly position fin 50 within housing 10.

When fin 50 is brazed or welded to recessed portion 23 of bottom wall 20, and to the undersurface of lid 30, a series of adjacent flow passages 60 are formed by the inner surfaces of two adjacent fin walls 54. A liquid-cooled heat sink 5 having a corrugated fin 50 is operated in the same manner as when plurality of pins 25 are employed. Here however, the need for turbulent flow is reduced as a result of the substantially increased heat transfer properties created by the increased surface area provided by fin walls 54 within flow passages 60.

It is to be understood that the present invention is by no means limited only to the particular constructions herein disclosed and shown in the drawings, but also comprises any modifications or equivalents within the scope of the claims.

What is claimed is:

1. A liquid-cooled heat sink comprising:

a housing including a side wall extending from the perimeter of a bottom wall and a lid sized to engage said peripheral side wall so as to form a chamber within said housing;

a fluid inlet port and a fluid outlet port defined through said lid so as to be in fluid communication with said chamber; and a fin comprising a plurality of corrugations positioned within said chamber so that at least one of said corrugations engages said bottom wall and at least one of said corrugations is secured to a surface of said lid, wherein at least one hole is defined through at least one of said corrugations and arranged so as to receive at least one pin when said fin is positioned within said chamber such that a portion of said corrugation and said surface of said lid engage said pin, so that said fin is fixed in position within said housing.

2. A liquid-cooled heat sink according to claim 1 wherein said fin comprises a plurality of fin walls that are folded relative to one another so as to form a plurality of substantially flat crests.

3. A liquid-cooled heat sink according to claim 2 wherein said fin walls are parallel to one another, with a constant wall-to-wall separation.

4. A liquid-cooled heat sink according to claim 1 wherein said fin and said at least one pin are brazed or welded to a recessed portion of said bottom wall and said lid thereby forming a plurality of adjacent flow passages.

* * * * *